United States Patent
Schricker et al.

(10) Patent No.: US 9,935,244 B2
(45) Date of Patent: Apr. 3, 2018

(54) LIGHT EMITTING DEVICE INCLUDING A FILTER AND A PROTECTIVE LAYER

(71) Applicant: KONINKLIJKE PHILIPS N.V., Eindhoven (NL)

(72) Inventors: April Dawn Schricker, Palo Alto, CA (US); Hans-Helmut Bechtel, Roetgen (DE); Kim Kevin Mai, San Jose, CA (US); Thomas Diederich, Stolberg (DE); Joost Peter Andre Vogels, Leende (NL); Uwe Mackens, Aachen (DE); Matthias Heidemann, Alsdorf (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/203,025

(22) Filed: Jul. 6, 2016

(65) Prior Publication Data
US 2016/0315070 A1 Oct. 27, 2016

Related U.S. Application Data

(63) Continuation of application No. 14/440,479, filed as application No. PCT/IB2013/059664 on Oct. 25, 2013.
(Continued)

(51) Int. Cl.
*H01L 33/44* (2010.01)
*H01L 33/56* (2010.01)
(Continued)

(52) U.S. Cl.
CPC .......... *H01L 33/44* (2013.01); *H01L 25/0753* (2013.01); *H01L 25/50* (2013.01);
(Continued)

(58) Field of Classification Search
CPC ..... H01L 33/44; H01L 33/50; H01L 25/0753; H01L 33/52; H01L 33/56
See application file for complete search history.

(56) References Cited

U.S. PATENT DOCUMENTS

| 5,813,752 A | 9/1998 | Singer et al. |
| 7,256,483 B2 | 8/2007 | Epler et al. |

(Continued)

FOREIGN PATENT DOCUMENTS

| CN | 101878540 A | 11/2010 |
| CN | 102214651 A | 10/2011 |

(Continued)

OTHER PUBLICATIONS

EPO as ISA, PCT/IB2013/059664 filed Oct. 25, 2013, "International Search Report and Written Opinion", dated Mar. 20, 2014, 13 pages.
(Continued)

*Primary Examiner* — Fei Fei Yeung Lopez

(57) ABSTRACT

A method according to embodiments of the invention includes providing a plurality of LEDs attached to a mount. A filter is attached to at least one of the plurality of LEDs. A protective layer is formed over the filter. A reflective layer is formed over the mount. A portion of the reflective layer disposed over the protective layer is removed.

10 Claims, 2 Drawing Sheets

Related U.S. Application Data

(60) Provisional application No. 61/723,342, filed on Nov. 7, 2012.

(51) Int. Cl.

| | | |
|---|---|---|
| *H01L 25/075* | (2006.01) | |
| *H01L 33/60* | (2010.01) | |
| *H01L 25/00* | (2006.01) | |
| *H01L 33/00* | (2010.01) | |
| *H01L 33/52* | (2010.01) | |
| *H01L 33/58* | (2010.01) | |
| *H01L 33/62* | (2010.01) | |
| *H01L 33/46* | (2010.01) | |
| *H01L 33/50* | (2010.01) | |

(52) U.S. Cl.
CPC ............ *H01L 33/005* (2013.01); *H01L 33/50* (2013.01); *H01L 33/52* (2013.01); *H01L 33/56* (2013.01); *H01L 33/58* (2013.01); *H01L 33/60* (2013.01); *H01L 33/62* (2013.01); *H01L 33/46* (2013.01); *H01L 33/501* (2013.01); *H01L 33/502* (2013.01); *H01L 33/505* (2013.01); *H01L 2224/16225* (2013.01); *H01L 2924/0002* (2013.01); *H01L 2933/0025* (2013.01); *H01L 2933/0033* (2013.01); *H01L 2933/0041* (2013.01); *H01L 2933/0058* (2013.01)

(56) References Cited

U.S. PATENT DOCUMENTS

| | | | |
|---|---|---|---|
| 7,531,856 B2 | 5/2009 | Kobori | |
| 7,875,533 B2 | 1/2011 | Epler et al. | |
| 2005/0051816 A1 | 3/2005 | Yamauchi | |
| 2005/0287687 A1* | 12/2005 | Liao | H01L 33/0079 438/22 |
| 2007/0145350 A1 | 6/2007 | Kobori | |
| 2009/0236619 A1* | 9/2009 | Chakroborty | H01L 33/44 257/89 |
| 2010/0029023 A1 | 2/2010 | Neff et al. | |
| 2010/0265694 A1* | 10/2010 | Kim | G02B 6/0021 362/97.1 |
| 2010/0296312 A1 | 11/2010 | Van Gorkom et al. | |
| 2011/0019411 A1 | 1/2011 | Petersen et al. | |
| 2011/0031516 A1 | 2/2011 | Basin et al. | |
| 2011/0175117 A1* | 7/2011 | Jagt | H01L 33/44 257/88 |
| 2012/0001204 A1 | 1/2012 | Jagt | |
| 2012/0140506 A1 | 6/2012 | Waragawa et al. | |
| 2013/0113010 A1 | 5/2013 | Brunner et al. | |
| 2015/0188001 A1* | 7/2015 | Schricker | H01L 33/0041 257/98 |

FOREIGN PATENT DOCUMENTS

| | | |
|---|---|---|
| CN | 102637802 A | 8/2012 |
| JP | 2000515689 A | 11/2000 |
| JP | 2006515963 A | 6/2006 |
| JP | 2012521066 A | 9/2012 |
| JP | 2012525697 A | 10/2012 |
| TW | 201115790 A1 | 5/2011 |
| TW | 201123549 A1 | 7/2011 |
| WO | 2004068597 A2 | 8/2004 |
| WO | 2011134777 A1 | 11/2011 |
| WO | WO-2013038304 A1 | 3/2013 |

OTHER PUBLICATIONS

CN Office Action, application 201380058246.8, Mar. 20, 2017, 21 pps.
Office Action dated Sep. 26, 2017, Taiwan Patent Application No. 102140329, 10 pages.
Office Action dated Oct. 10, 2017, Japan Patent Application No. 2015-540246, 8 pages.

* cited by examiner

LIGHT EMITTING DEVICE INCLUDING A FILTER AND A PROTECTIVE LAYER

CROSS-REFERENCE TO RELATED APPLICATIONS

The present application is a continuation of U.S. patent application Ser. No. 14/440,479 filed on May 4, 2015, titled "LIGHT EMITTING DEVICE INCLUDING A FILTER AND A PROTECTIVE LAYER", which is a § 371 application of International Application No. PCT/IB2013/059664 filed on Oct. 25, 2013, which claims priority to U.S. Provisional Patent Application No. 61/723,342 filed on Nov. 7, 2012. U.S. patent application Ser. No. 14/440,479, International Application No. PCT/IB2013/059664, and U.S. Provisional Patent Application No. 61/723,342 are incorporated herein.

FIELD OF THE INVENTION

The present invention relates to light emitting device with a filter and a protective layer.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates a flip chip LED described in more detail in U.S. Pat. No. 7,256,483. The LED includes n-type layers 16, an active layer 18, and p-type layers 20 grown on a sapphire growth substrate (not shown). Portions of the p-layer 20 and active layer 18 are etched away during the LED forming process, and metal 50 (metallization layer plus bonding metal) contacts the n-layer 16 on the same side as the p-contact metal 24. An underfill material 52 may be deposited in the voids beneath the LED to reduce thermal gradients across the LED, add mechanical strength to the attachment between the LED and the package substrate, and prevent contaminants from contacting the LED material. The n-metal 50 and p-metal 24 are bonded to the pads 22A and 22B, respectively, on a package substrate 12. Contact pads 22A and 22B on package substrate 12 are connected to solderable electrodes 26A and 26B using vias 28A and 28B and/or metal traces. The growth substrate is removed, exposing a surface of n-type layer 16. This surface is roughened for increased light extraction, for example by photo-electrochemical etching using a KOH solution.

SUMMARY

It is an object of the invention to provide a light emitting device with a filter. The filter is protected by a protective layer.

A method according to embodiments of the invention includes providing a plurality of LEDs attached to a mount. A filter is attached to at least one of the plurality of LEDs. A protective layer is formed over the filter. A reflective layer is formed over the mount. A portion of the reflective layer disposed over the protective layer is removed.

Embodiments of the invention include a plurality of LEDs attached to a mount. A filter is disposed over the LEDs. A transparent layer is disposed over the filter. Reflective material is disposed between neighboring LEDs.

DETAILED DESCRIPTION

In order to meet specifications for particular applications, it is sometimes necessary to filter the light emitted by LEDs. In embodiments of the invention, a filter is disposed in the path of light emitted by an LED. A protective layer may be formed over the filter to protect the filter during processing and/or operation of the LED. Though in the examples below the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 2:
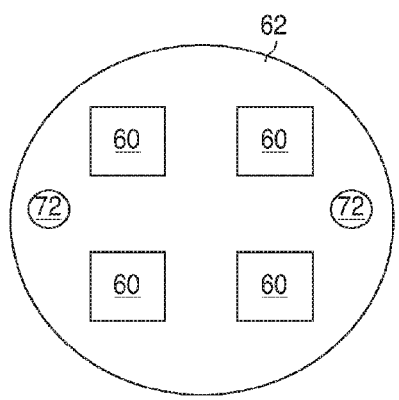
FIG. 2 is a plan view of a group of LEDs disposed on a mount.

FIG. 2 is a plan view of a group of LEDs 60 attached to a mount. In FIG. 2, four LEDs 60 are illustrated attached to mount 62 in a two by two array. A single LED or any number of LEDs 60 may be attached to mount 62 in any suitable arrangement, as dictated by the application. In some embodiments, bond pads 72 on mount 62 are used to supply power to the LEDs 60.

Figure 1:
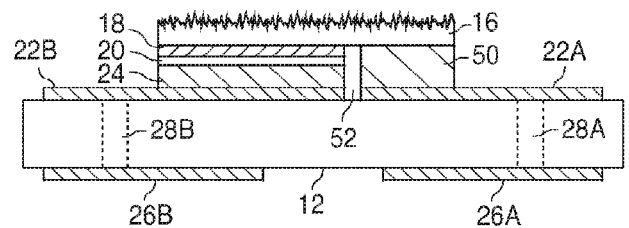
FIG. 1 illustrates a flip chip LED with a roughened top surface.

Any LED 60 in the following figures may be, for example, a flip chip device configured to emit a majority of light from the top surface of the LED. One example of a suitable LED 60 is illustrated in FIG. 1, though any suitable LED may be used. To form a III-nitride LED, a III-nitride semiconductor structure is first grown on a growth substrate, as is known in the art. The growth substrate may be any suitable substrate such as, for example, sapphire, SiC, Si, GaN, or a composite substrate. The semiconductor structure includes a light emitting or active region sandwiched between n- and p-type regions. An n-type region may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region is grown over the n-type region. Examples of suitable light emitting regions include a single thick or thin light emitting layer, or a multiple quantum well light emitting region including multiple thin or thick light emitting layers separated by barrier layers. A p-type region may then be grown over the light emitting region. Like the n-type region, the p-type region may include multiple layers of different composition, thickness, and dopant concentration, including layers that are not intentionally doped, or n-type layers. The total thickness of all the semiconductor material in the device is less than 10 µm in some embodiments and less than 6 µm in some embodiments. In some embodiments, the p-type region is grown first, followed by the active region and the n-type region.

A metal p-contact is formed on the p-type region. If a majority of light is directed out of the semiconductor structure through a surface opposite the p-contact, such as in a flip chip device, the p-contact may be reflective. A flip chip device may be formed by patterning the semiconductor structure by standard photolithographic operations and etching the semiconductor structure to remove a portion of the entire thickness of the p-type region and a portion of the entire thickness of the light emitting region, to form a mesa which reveals a surface of the n-type region on which a metal n-contact is formed. The mesa and p- and n-contacts may be formed in any suitable manner. Forming the mesa and p- and n-contacts is well known to a person of skill in the art.

Figure 3:
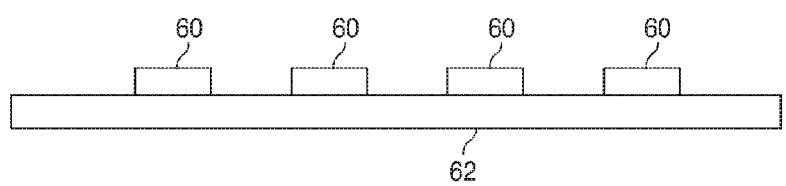
FIG. 3 is a cross sectional view of LEDs disposed on a mount.

FIG. 3 is a simplified cross sectional view of four LEDs 60 attached to mount 62. The LEDs may be part of a 2 by 2 array, a linear array, or any other suitable arrangement. More or fewer LEDs than the four illustrated may be mounted on a single mount 62. The LEDs 60 may be connected to mount 62 through the p- and n-contacts, gold stud bumps or any other suitable connection mechanism. An underfill material such as epoxy, silicone, or any other suitable material may be injected in any spaces beneath LEDs 60, between the LEDs 60 and the mount 62. The mount 62 and underfill may mechanically support the semiconductor structure during later processing steps, such as removing the growth substrate. Any suitable mount may be used. Examples of suitable mounts include an insulating or semi-insulating wafer with conductive vias for forming electrical connections to the semiconductor structure, such as a silicon wafer or a ceramic wafer, a metal structure, or any other suitable mount. In some embodiments, thick metal bonding pads are formed on the semiconductor structure to support the semiconductor structure during processing such as removing the growth substrate. The growth substrate may be partially or totally removed, before or after attaching LEDs 60 to mount 62, or the growth substrate may remain part of the device. The semiconductor structure exposed by removing the growth substrate may be roughened, patterned, or textured to increase light extraction.

Figure 4:
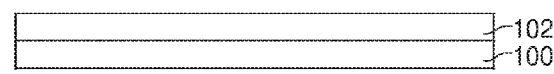
FIG. 4 is a cross sectional view of a filter disposed on a wavelength converting layer.
Figure 5:
FIG. 5 illustrates the structure of FIG. 4 after forming a protective layer over the filter.
Figure 6:
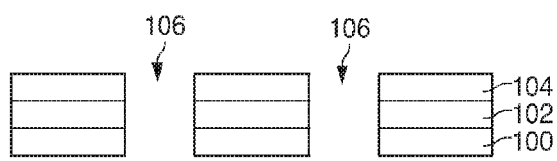
FIG. 6 illustrates the structure of FIG. 5 after singulation.

In a process separate from that illustrated by FIG. 3, a wavelength converting structure is prepared, as illustrated in FIGS. 4, 5, and 6.

In FIG. 4, a filter layer 102 is formed on a wavelength converting structure 100. Wavelength converting structure 100 is a prefabricated wavelength converting member (i.e. a self-supporting wavelength converting member that is formed separate from LEDs 60 and mount 62 of FIG. 3) that includes one or more wavelength converting materials that absorb light emitted by the LEDs and emit light of a different wavelength. One example of a suitable wavelength converting structure 100 is a self-supporting wavelength converting ceramic slab. A wavelength converting ceramic may be, for example, a powder phosphor that is sintered into a self-supporting slab. The slab generally contains no binder material other than the phosphor itself. Suitable slabs may be, for example, at least 50 µm thick in some embodiments, no more than 500 µm thick in some embodiments, at least 100 µm thick in some embodiments, and no more than 300 µm thick in some embodiments. Another example of a suitable wavelength converting structure 100 is a powder wavelength converting material disposed in a transparent material to form a self-supporting structure. Examples of suitable transparent materials include silicone, glass, and epoxy.

The wavelength converting material(s) in the wavelength converting structure 100 may be conventional phosphors, organic phosphors, quantum dots, organic semiconductors, II-VI or III-V semiconductors, II-VI or III-V semiconductor quantum dots or nanocrystals, dyes, polymers, or materials that luminesce. Any suitable powder phosphor may be used, including but not limited to garnet-based phosphors such as $(Y,Gd,La,Lu,T,Pr,Sm)_3(Al,Ga,In)_5O_{12}$:Ce, $(Lu_{1-x-y-a-b}Yx Gdy)_3(Al_{1-z}Gaz)_5O_{12}$:$Ce_aPr_b$ wherein $0<x<1$, $0<y<1$, $0<z\leq0.1$, $0<a\leq0.2$ and $0<b\leq0.1$, $Y_3Al_5O_{12}$:Ce(YAG), $Lu_3Al_5O_{12}$:Ce (LuAG), $Y_3Al_{5-x}Ga_xO_{12}$:Ce (YAlGaG), $(Ba_{1-x}Sr_x)SiO_3$:Eu (BOSE), and nitride-based phosphors such as $(Ca,Sr)AlSiN_3$:Eu and $(Ca,Sr,Ba)_2Si_5N_8$:Eu.

Wavelength converting structure 100 may include a single wavelength converting material, a mixture of wavelength converting materials, or multiple wavelength converting materials formed as separate layers rather than mixed together. Wavelength converting materials emitting different colors of light may be disposed in separate regions of wavelength converting structure 100 or mixed together.

A filter layer 102 may be deposited onto one side of the wavelength converting structure 100. In some embodiments, filter layer 102 is a dichroic filter. A dichroic filter may consist of thin layers of alternating materials such as $Nb_2O_5$, $SiO_2$, $TiO_2$ and any other suitable material. The thickness of filter layer 102 may be at least 10 nm in some embodiments, no more than 5 µm thick in some embodiments, at least 1 µm thick in some embodiments, and no more than 2 µm thick in some embodiments. The total number of layers in filter layer 102 may be at least 2 layers in some embodiments, no more than 50 layers in some embodiments, at least 10 layers in some embodiments, and no more than 30 layers in some embodiments. Each layer may be the same thickness or layers of different thickness may be used. A dichroic filter layer 102 may be deposited on wavelength converting structure 100 by any suitable technique including megatron sputtering, DC sputtering, plasma vapor deposition, chemical vapor deposition, and evaporation.

Figure 10:
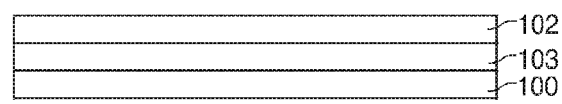
FIG. 10 is a cross sectional view of a smoothing layer disposed between a filter and a wavelength converting layer.

In some embodiments, as illustrated in FIG. 10, a smoothing layer 103 is disposed between wavelength converting structure 100 and filter 102. The surface of the wavelength converting structure 100 may play a role in the effectiveness of filter 102. In some embodiments, the performance of filter 102 improves if it is smoother; accordingly, a smoothing layer 103 designed to form a smooth surface on which filter 102 is disposed may be formed on wavelength converting structure 100 before deposition of filter 102. For example, a wavelength converting ceramic slab may have a surface root mean square (RMS) roughness between 10 nm and 600 µm. If the RMS roughness is greater than, for example, 300 µm in some embodiments, a smoothing layer 103 may be formed over wavelength converting structure 100, before forming filter 102. The smoothing layer 103 may be, for example, $Nb_2O_5$, one or more oxides of silicon, one or more oxides of titanium, one or more nitrides of silicon, one or more transition metal oxides, or one or more transition metal nitrides. The smoothing layer 103 may be, for example, at least 5 nm thick in some embodiments, no more than 500 µm thick in some embodiments, at least 1 µm thick in some embodiments, and no more than 20 µm thick in some embodiments.

Variations in the thickness of a dichroic filter layer 102 may undesirably increase the size of the "color cloud" extracted from the device (i.e. the distribution of color points extracted from the device) and/or disrupt color targeting of the combined spectrum emitted by the wavelength converting materials and the LEDs.

Accordingly, in FIG. 5, a clear non-wavelength converting protective layer 104 is created above the filter layer 102. This protective layer 104 may include, for example, silicone compounds KJR9222A/B and KRJ9226D, as well as other materials. In some embodiments, the protective layer 104 has a refractive index that is the same as filter layer 102, to avoid losses at the boundary between the layers 102 and 104. The protective layer 104 may be formed over the filter layer 102 using any of a variety of techniques, including, for example, screen printing, lamination, overmolding, casting, and so on.

To facilitate the formation of the protective layer 104 over the filter layer 102, the filter layer 102 may be subjected to treatments, such as oxygen plasma, UV ozone, and the like, typically for between 2 and 30 minutes. To maximize the effectiveness of this treatment, the delay between the treatment and the formation of the protective layer 104, if any, should not exceed a few hours.

The thickness of the protective layer 104 will be dependent upon the expected degree of control of the effects of micro-bead blasting, or other processes that reduce the thickness, and may range from 2 to 100 µm. Assuming conventional processing techniques, a protective layer thickness of 20-40 µm will generally be sufficient. If silicone is used as the protective material, a schedule of curing may be 1 hr at 80° C., followed by 1 hr at 120° C., and then followed by 4 hr at 150° C.

Another example of a suitable protective layer 104 is an optically transparent solid state film, such as a single layer of $Nb_2O_5$, $TiO_2$, $SiO_2$, or $TaO_2$ formed on top of the filter layer 102. The advantage of a solid state protective layer 104 is that the number of processing steps may be reduced if the solid state protective layer is deposited with the same tool and at the same time as a dichroic filter 102, described above. A solid state protective layer 104 may be no more than 5 µm thick in some embodiments, and no more than 500 nm thick in some embodiments.

In FIG. 6, the structure including wavelength converting structure 100, filter layer 102, smoothing layer 103 if present, and protective layer 104 is diced, for example by sawing or any other suitable technique, in regions 106.

Figure 7:
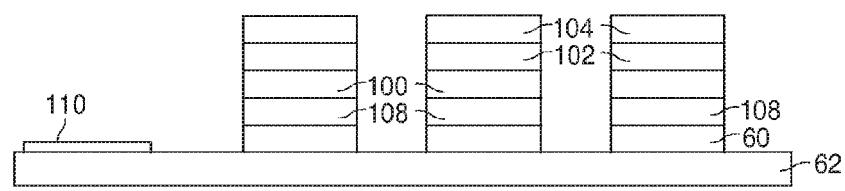
FIG. 7 is a cross sectional view of the structures of FIG. 6 attached to the LEDs illustrated in FIG. 3.

In FIG. 7, the diced structures are attached to the LEDs 60, which are attached to mount 62. One bond pad 110 is illustrated on the left side of mount 62. Each wavelength converting structure 100 may be connected to an LED 60 by an adhesive 108. Any suitable adhesive may be used. One example of a suitable adhesive is silicone that is disposed over LEDs 60, on the surface of wavelength converting structure 100 opposite filter layer 102, or on both surfaces. For example, in some embodiments, adhesive 108 is drop-wise-dispensed (dispensed as a series of drops) over each LED 60.

In some embodiments, a wavelength converting material may be disposed in adhesive layer 108. For example, a powder phosphor may be mixed with a silicone adhesive layer 108, then disposed over LEDs 60.

The selection of wavelength converting materials in any wavelength converting structures in the device, such as wavelength converting structure 100 and adhesive layer 108, the amount of wavelength converting material used, the filter materials and thickness in some embodiments are selected to match the peak wavelength of light emitted by LED 60, such that the combined unconverted pump light from LED 60 and wavelength converted light exiting the structured meets a predetermined specification, for example for color point and lumen output.

Unconverted light emitted by LEDs 60 is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light emitted from the structure.

In some embodiments, LEDs 60 emit light having a peak wavelength that is blue, wavelength converting structure 100 includes one or more wavelength converting materials that absorb light emitted by LEDs 60 and emit green and/or yellow light, and a wavelength converting material such as a phosphor that absorbs either blue light from LEDs 60 or wavelength converted light from wavelength converting structure 100 and emits red light is disposed in adhesive layer 108. In some embodiments, LEDs 60 emit light having a peak wavelength that is blue and wavelength converting structure 100 includes one or more wavelength converting materials that absorb light emitted by LEDs 60 and emit some or all of green, yellow, and red light, such that no additional wavelength converting material is disposed in adhesive layer 108.

Figure 8:
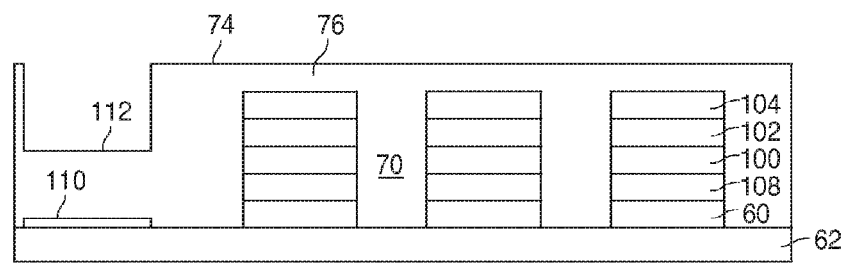
FIG. 8 illustrates the structure of FIG. 7 after forming a reflective layer over the structure.

In FIG. 8, a reflective material 74 is formed over LEDs 60 and mount 62. Reflective material 74 fills the regions 70 between neighboring LEDs 60. Reflective material 74 may be, for example, reflective particles such as $TiO_2$ or aluminum oxide particles disposed in a transparent or reflective supporting matrix, such as silicone. Reflective material layer 74 may be formed by any suitable technique, including, for example, pressing a mixture of reflective particles and supporting matrix into regions 70 or molding. As illustrated in FIG. 8, reflective material 74 may be disposed in regions 76 over the tops of the protective layer 104 over each device.

In some embodiments, reflective material 74 is formed by a technique such as molding that facilitates forming a thinner region 112 of reflective material over bonding pad 110, as illustrated in FIG. 8.

Figure 9:
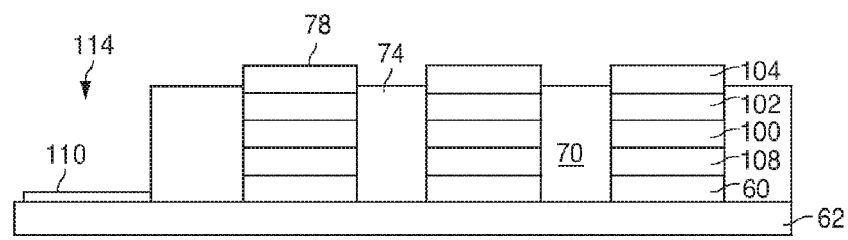
FIG. 9 illustrates the structure of FIG. 8 after thinning the reflective layer to expose a top surface of the protective layer.

In FIG. 9, reflective material 74 is thinned to expose the tops 78 of protective layer 104 over LEDs 60 and to expose bonding pad 110 in region 114. Protective layer 104 protects filter layer 102 from damage while reflective material 74 is removed. Excess reflective material 74 may be removed by any suitable technique, including for example, etching or mechanical techniques such as micro bead blasting, wet bead blasting, dry bead blasting, and grinding. For example, in dry bead blasting, 80 μm baking soda particles impinge on the surface of reflective material 74 in a stream of air. In another example, in wet bead blasting, 180 μm plastic particles in a water slurry are directed at the surface of reflective material 74. Due to the different etch mechanisms, dry bead blasting is suitable when the protective layer 104 is silicone and wet bead blasting is suitable when the protective layer 104 is silicone or a solid state material such as $Nb_2O_5$, $TiO_2$, or $SiO_2$.

The protective layer 104 layer protects and preserves the thickness of the filter layer 102, potentially avoiding thickness variations which may undesirably increase the color point cloud. The protective layer 104 should be thick enough to accommodate the removal variation of the technique used to remove excess reflective material 74 without allowing punch-through damage of the filter layer 102. The reflective material 74 may be less resistant to the removal process than protective layer 104. The technique used to remove excess reflective material 74 may facilitate surface roughening of the protective layer 104 which may improve light extraction.

In some embodiments, after excess reflective material 74 is removed, the top surface 78 of protective layer 104 is exposed, as illustrated in FIG. 9. Reflective material 74 in regions 70 between LEDs 60 prevents light from escaping from the sides of LEDs 60 and the sides of wavelength converting structure 100, such that a majority of light is extracted through the top of LEDs 60, wavelength converting structure 100, and filter layer 102. In some embodiments, reflective material 74 is in direct contact with the sides of LEDs 60, wavelength converting structure, filter 102, and a portion of protective layer 104, as illustrated in FIG. 9. In some embodiments, the top surface of reflective material 74 is level (planarized) with the top surface 78 of protective layer 104.

In some embodiments, the top surface 78 of protective film 68 is roughened, textured, or patterned to improve light extraction. The roughening, texturing, or patterning on the surface may be formed by the same process that removes excess reflective material 74, or in one or more separate processing steps.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A structure, comprising:
   a plurality of LEDs attached to a mount;
   a plurality of wavelength converting layers disposed over the LEDs;
   a plurality of transparent layers disposed over the wavelength converting layers;
   a reflective material disposed in areas between neighboring LEDs; and
   a top surface of the structure comprising the transparent layers over the LEDs and the reflective material over the areas between the neighboring LEDs, the top surface of the structure being substantially planar.

2. The structure of claim 1, wherein top surfaces of the transparent layers are roughened, textured, or patterned.

3. The structure of claim 1, wherein the reflective material is in direct contact with side surfaces of the neighboring LEDs.

4. The structure of claim 1, wherein each wavelength converting layer and each transparent layer have a substantially same width as a top surface of each LED.

5. The structure of claim 4, wherein the reflective material is in direct contact with sidewalls of neighboring transparent layers disposed over the neighboring LEDs.

6. The structure of claim 4, wherein the reflective material is in direct contact with sidewall of neighboring transparent layers disposed over the neighboring LEDs.

7. The structure of claim 4, wherein top surfaces of the transparent layers are roughened, textured, or patterned.

8. The structure of claim 4, wherein the reflective material is in direct contact with side surfaces of the neighboring LEDs.

9. The structure of claim 4, wherein the reflective material is in direct contact with the mount.

10. The structure of claim 1, wherein the reflective material is in direct contact with portions of the wavelength converting layers and the mount.

* * * * *